US011259440B1

(12) United States Patent
Chen

(10) Patent No.: US 11,259,440 B1
(45) Date of Patent: Feb. 22, 2022

(54) COMPUTER CASE

(71) Applicant: ANTEC INC., Taipei (TW)

(72) Inventor: Ming-Yung Chen, Taipei (TW)

(73) Assignee: ANTEC INC., Taipei (TW)

( * ) Notice: Subject to any disclaimer, the term of this patent is extended or adjusted under 35 U.S.C. 154(b) by 0 days.

(21) Appl. No.: 17/092,510

(22) Filed: Nov. 9, 2020

(51) Int. Cl.
*H05K 7/20* (2006.01)
*G06F 1/20* (2006.01)

(52) U.S. Cl.
CPC .......... *H05K 7/20172* (2013.01); *G06F 1/20* (2013.01)

(58) Field of Classification Search
CPC ........ H05K 7/20172; G06F 1/20; G06F 1/203
See application file for complete search history.

(56) References Cited

U.S. PATENT DOCUMENTS

| 5,414,591 | A | * | 5/1995 | Kimura | G06F 1/20 361/679.33 |
| 5,813,243 | A | * | 9/1998 | Johnson | G06F 1/20 361/678 |
| 6,875,101 | B1 | * | 4/2005 | Chien | G06F 1/181 248/188.8 |
| 7,324,338 | B1 | * | 1/2008 | Chi | G06F 1/20 361/679.48 |
| 8,130,491 | B2 | * | 3/2012 | Lee | G06F 1/20 361/679.33 |
| 8,416,567 | B2 | * | 4/2013 | Cheng | G06F 1/20 361/679.48 |
| 10,133,322 | B1 | * | 11/2018 | Bouve | H01L 23/427 |
| 2006/0039107 | A1 | * | 2/2006 | Kumano | G06F 1/181 361/690 |
| 2008/0019092 | A1 | * | 1/2008 | Chen | G06F 1/20 361/695 |
| 2008/0310097 | A1 | * | 12/2008 | Sherrod | H05K 7/1492 361/679.4 |
| 2009/0059516 | A1 | * | 3/2009 | Lai | G06F 1/20 361/679.48 |
| 2012/0287571 | A1 | * | 11/2012 | Santos | G06F 1/206 361/679.48 |
| 2013/0120935 | A1 | * | 5/2013 | Huang | G06F 1/20 361/695 |
| 2014/0063726 | A1 | * | 3/2014 | Liu | G06F 1/20 361/679.33 |
| 2015/0099447 | A1 | * | 4/2015 | Oh | G06F 1/20 454/184 |
| 2016/0098068 | A1 | * | 4/2016 | Liu | G06F 1/20 361/679.5 |
| 2017/0108900 | A1 | * | 4/2017 | Chou | G06F 1/20 |

(Continued)

*Primary Examiner* — Stephen S Sul

(74) *Attorney, Agent, or Firm* — Muncy, Geissler, Olds & Lowe, P.C.

(57) ABSTRACT

A computer case is provided, including: a housing, at least one partition and a plurality of fans. The housing has an assembling space and includes a front side plate, a rear side plate, a left side plate, a right side plate and a bottom side plate. The at least one partition divides the assembling space into a first area configured for a power supplier to disposed therewithin and a second area. The at least one partition has at least one through hole communicated the first area with the second area. The plurality of fans includes at least one first fan disposed on the front side plate, at least one second fan disposed on the rear side plate and at least one third fan disposed on the at least one partition. The at least one third fan corresponds to the at least one through hole.

1 Claim, 4 Drawing Sheets

(56) References Cited

U.S. PATENT DOCUMENTS

2017/0280592 A1* 9/2017 Lai ............................ G06F 1/20
2018/0341297 A1* 11/2018 Kinstle, III ........ H05K 7/20209
2019/0073005 A1* 3/2019 Han ....................... G06F 1/181

* cited by examiner

COMPUTER CASE

BACKGROUND OF THE INVENTION

Field of the Invention

The present invention relates to a computer case.

Description of the Prior Art

With the development of technology, a computer is required to provide good performance and higher execution efficiency. Most components of the computer have to consume electric energy to provide preferable performance, which results in high working temperature during execution. As a result, the computer is easy to crash or decrease in performance. To solve the problem as described above, fans are disposed on a computer case to provide heat dissipation effect.

However, fans and vents of a conventional computer case are not appropriately arranged to effectively guide airflow, which results in poor heat dissipation effect.

The present invention is, therefore, arisen to obviate or at least mitigate the above-mentioned disadvantages.

SUMMARY OF THE INVENTION

The main object of the present invention is to provide a computer case which has good heat dissipation effect.

To achieve the above and other objects, the present invention provides a computer case, including: a housing, at least one partition and a plurality of fans. The housing has an assembling space and includes a front side plate, a rear side plate, a left side plate, a right side plate and a bottom side plate. The at least one partition is transversely disposed between the front side plate and the rear side plate and divides the assembling space into a first area configured to receive a power supplier and a second area, and the first area is located below the second area. The at least one partition has at least one through hole communicating the first area with the second area and being overlapped with the bottom side plate. The bottom side plate has a first vent corresponds to the at least one through hole, and at least one of the left side plate and the right side plate has a second vent configured to communicate the first area with an external environment. The plurality of fans includes at least one first fan disposed on the front side plate, at least one second fan disposed on the rear side plate and at least one third fan disposed on the at least one partition, and the at least one third fan corresponds to the at least one through hole.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

Figure 1:
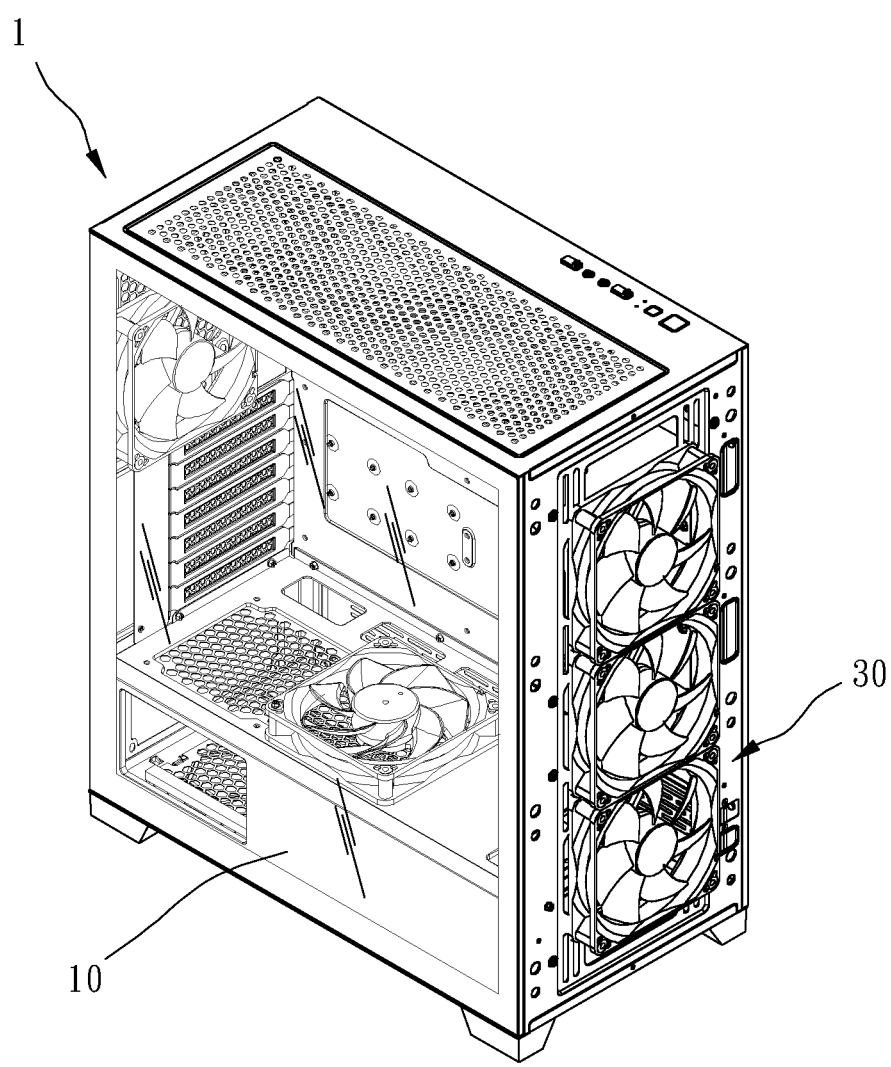
FIG. 1 is a stereogram of a preferable embodiment of the present invention.

Please refer to FIGS. 1 to 4 for a preferable embodiment of the present invention. A computer case 1 of the present invention includes a housing 10, at least one partition 20 and a plurality of fans 30.

The housing 10 has an assembling space 11 and includes a front side plate 12, a rear side plate 13 and a bottom side plate 14. The at least one partition 20 is transversely disposed between the front side plate 12 and the rear side plate 13 and divides the assembling space 11 into a first area 111 configured to receive a power supplier and a second area 112. The at least one partition 20 has at least one through hole 21 communicating the first area 111 with the second area 112 and being overlapped with the bottom side plate 14. The plurality of fans 30 includes at least one first fan 31 disposed on the front side plate 12, at least one second fan 32 disposed on the rear side plate 13 and at least one third fan 33 disposed on the at least one partition 20, and the at least one third fan 33 corresponds to the at least one through hole 21. Therefore, the computer case 1 has good heat dissipation effect.

Preferably, the first area 111 is located below the second area 112; the bottom side plate 14 has a first vent 141 corresponding to the at least one through hole 21, which allows cold air to flow from an external environment into the first area 111. The at least one third fan 33 is configured to guide air in the first area 111 to flow toward the second area 112, which provides good airflow effect and effectively cools the power supplier.

Figure 2:
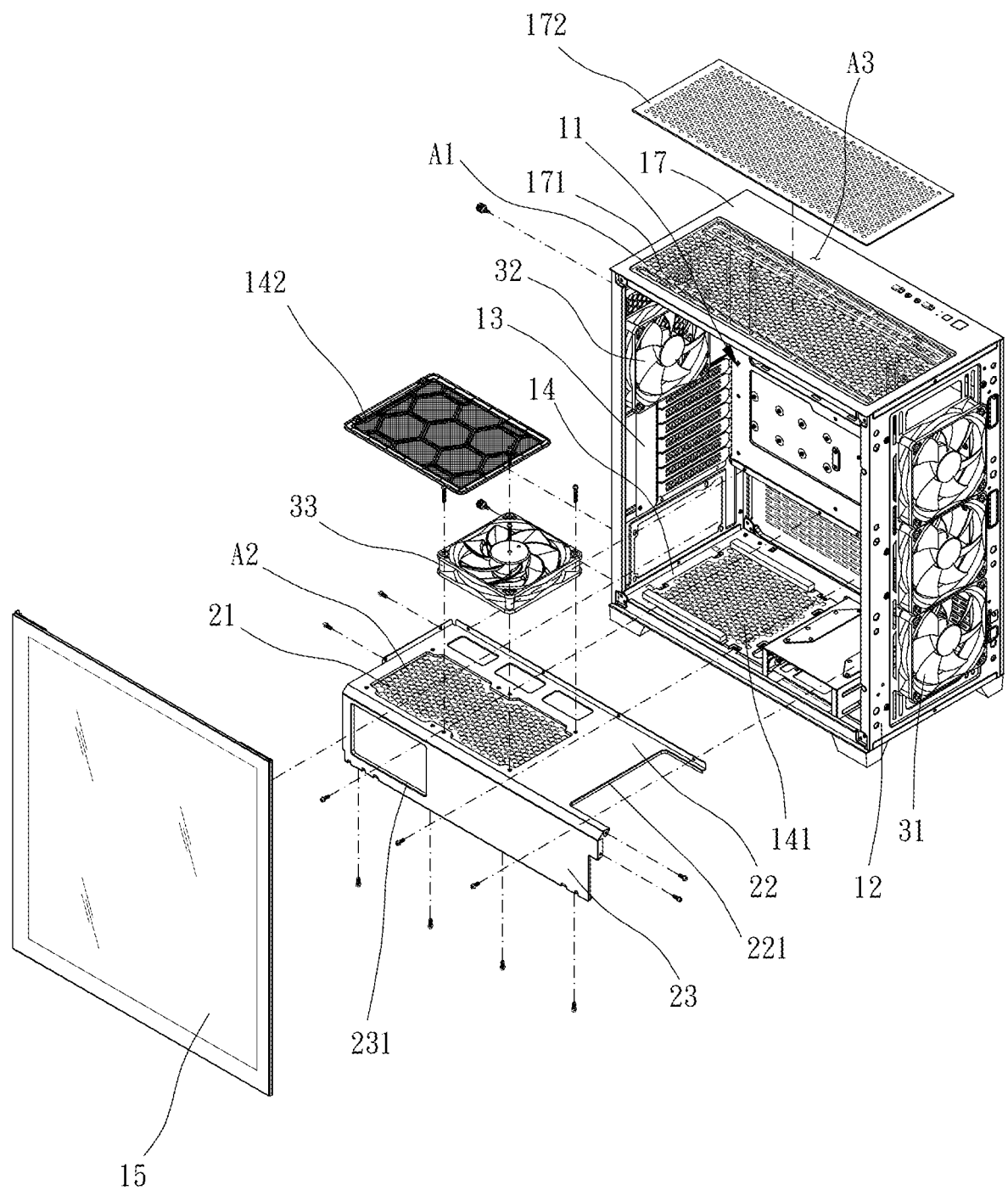
FIG. 2 is a breakdown drawing of a preferable embodiment of the present invention.
Figure 3:
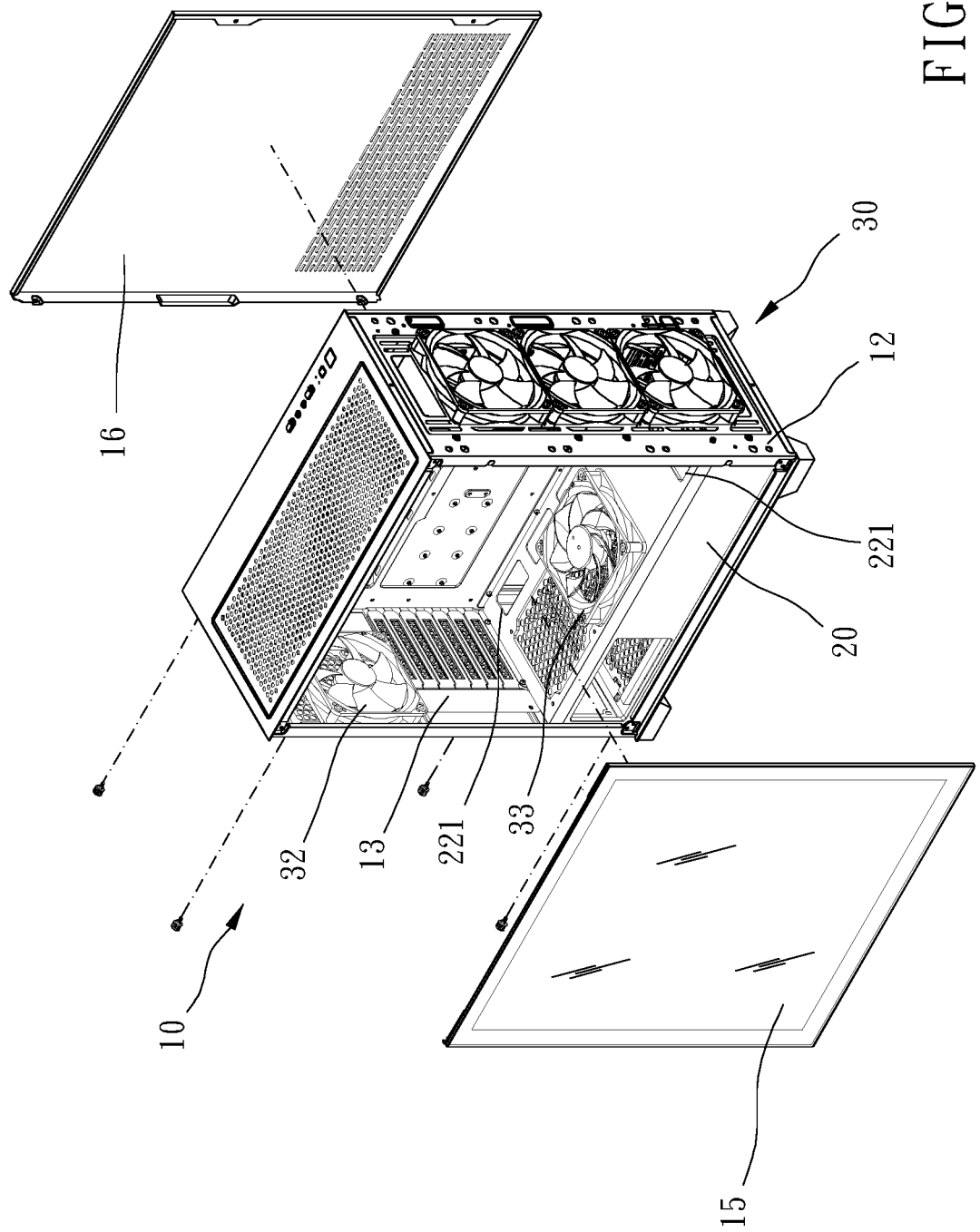
FIG. 3 is a partial breakdown drawing of a preferable embodiment of the present invention.

Please refer to FIGS. 2 and 3, in this embodiment, the at least one partition 20 is detachably connected to the housing 10 and includes a first portion 22 and a second portion 23 which are transitionally connected with each other, and the first portion 22 faces the bottom side plate 14 and has the at least one through hole 21 and the at least one third fan 33 disposed thereon, which is convenient to be assembled and effectively guides airflow in a middle portion of the assembling space 11. The housing 10 further includes a left side plate 15 and a right side plate 16. The first portion 22 is connected with one of the left side plate 15 and the right side plate 16, and the second portion 23 extends toward the bottom side plate 14 and is connected with the bottom side plate 14 so as to be stably assembled and have good connecting strength. However, the at least one partition may include a plurality of plates or a single plate connected across the housing; the at least one partition may be fixedly mounted to the housing. Preferably, at least one of the left side plate 15 and the right side plate 16 has a second vent 161 configured to communicate the first area 111 with the external environment so as to provide large air intake and increase heat dissipation effect.

Specifically, the at least one partition 20 preferably is integrally formed as one piece so as to have good structural strength. The first portion 22 further has a plurality of perforations 221, and one of the plurality of perforations 221 is open toward the front side plate 12, which is configured for wires or a water cooling radiator to be disposed therewithin. The second portion 23 has a window portion 231 configured to correspond to the power supplier so that the power supplier is viewable.

The housing 10 further includes a top side plate 17, and the top side plate 17 has a third vent 171 configured to communicate the second area 112 with the external environment. The third vent 171 corresponds to the at least one through hole 21, and a distribution area A1 of the third vent 171 is larger than or equal to a distribution area A2 of the at least one through hole 21 so as to effectively exhaust heat from the assembling space 11. Preferably, the distribution area A1 of the third vent 171 is larger than or equal to two-third of an extending area A3 of the top side plate 17 so as to provide good heat dissipation effect.

In this embodiment, the front side plate 12 has a plurality of said first fans 31, and a number of the plurality of said first fans 31 is respectively larger than a number of the at least one second fan 32 and a number of the at least one third fan 33, which allows the cold air to efficiently flow into the assembling space 11 and generates an airflow in a direction toward the rear side plate 13. The plurality of said first fans 31 are located out of the assembling space 11, which is convenient for arrangements of other components. A speed of each of the plurality of fans 30 may be 1400 RPM so as to have good guiding effect. At least one of the plurality of fans 30 is a ARGB (addressable RGB) fan which provides heat dissipation and a variety of lighting effects. However, the plurality of said first fans may be located in the assembling space; the speed of each of the plurality of fans may be changed according to requirements.

Preferably, the first vent 141, the second vent 161 and the third vent 171 respectively have at least one dust screen 142, 172 so as to prevent dust and impurities from entering the assembling space 11. Each of said dust screens 142, 172 may be attached to the housing 10 by magnetic attraction, insertion or engagement. One of the left side plate 15 and the right side plate 16 is a tempered glass board, which provides special visual effect. In other embodiments, the left side plate and the right side plate may be made of other materials.

Figure 4:
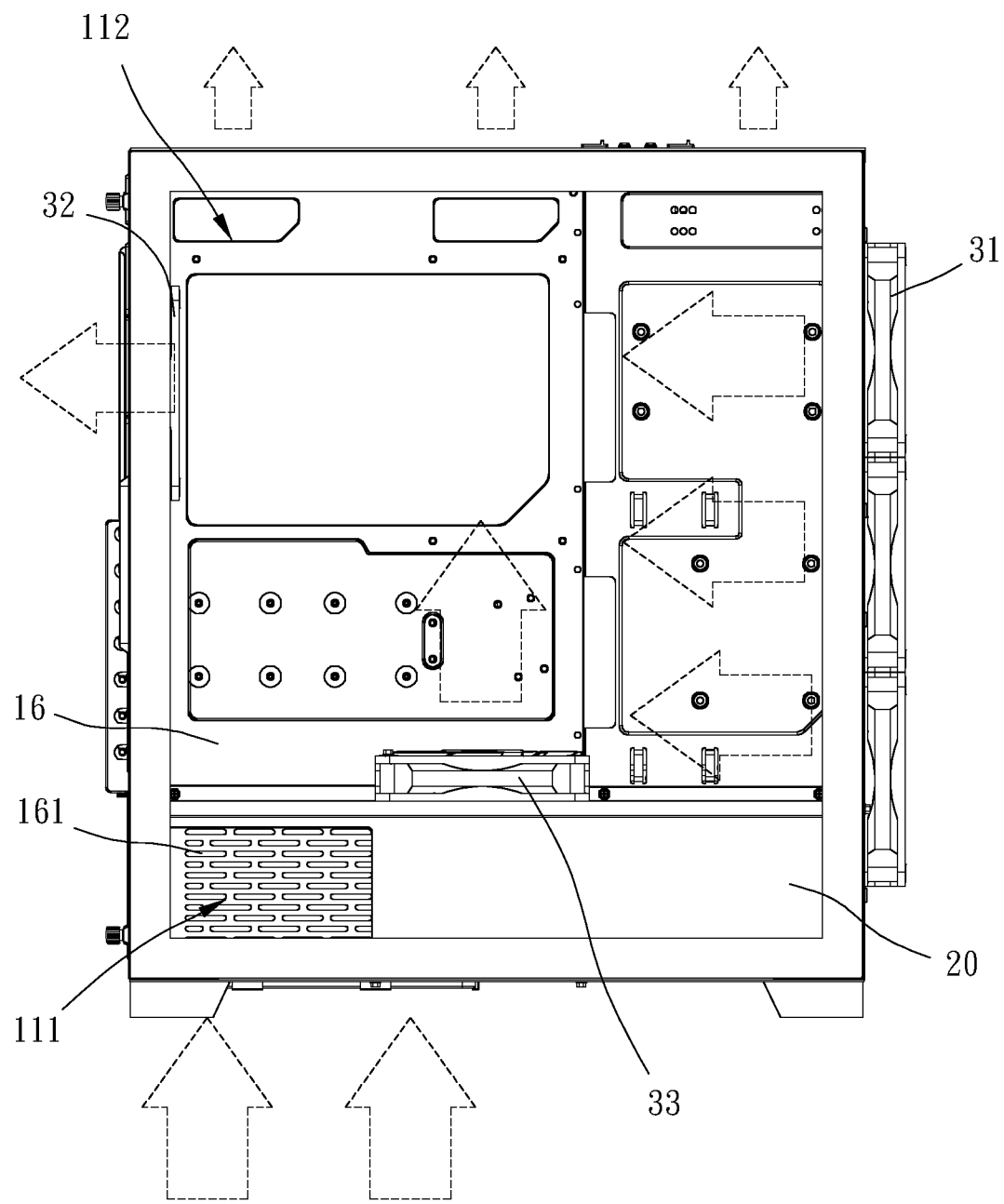
FIG. 4 is a side view of a preferable embodiment of the present invention.

Please refer to FIG. 4, the plurality of said first fans 31, the first vent 141 and the second vent 161 are configured for the cold air to flow into the assembling space 11. The at least one third fan 33 and the at least one through hole 21 are configured to effectively guide air in the first area 111 to flow into the second area 112, and the second fan 32 and the third vent 171 are configured to exhaust the air out of the second area 112. Therefore, the air in the assembling space 11 circulates smoothly, which provides good heat dissipation effect and effectively improves execution efficiency of the computer.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A computer case, including:
   a housing, having an assembling space, including a front side plate, a rear side plate, a left side plate, a right side plate and a bottom side plate;
   at least one partition, transversely disposed between the front side plate and the rear side plate and dividing the assembling space into a first area and a second area, the first area located below the second area, the at least one partition having at least one through hole communicating the first area with the second area and being overlapped with the bottom side plate, the bottom side plate having a first vent corresponding to the at least one through hole, at least one of the left side plate and the right side plate having a second vent configured to communicate the first area with an external environment; and
   a plurality of fans, including at least one first fan disposed on the front side plate, at least one second fan disposed on the rear side plate and at least one third fan disposed on the at least one partition, the at least one third fan corresponding to the at least one through hole;
   wherein the at least one partition is detachably connected to the housing and includes a first portion and a second portion which are transitionally connected with each other, and the first portion faces the bottom side plate and has the at least one through hole and the at least one third fan disposed thereon;
   wherein the first portion is connected with one of the left side plate and the right side plate, and the second portion extends toward the bottom side plate and is connected with the bottom side plate;
   wherein the at least one partition is integrally formed as one piece; the at least one third fan is configured to guide air in the first area to flow toward the second area; the housing further includes a top side plate, the top side plate has a third vent configured to communicate the second area with the external environment, the third vent corresponds to the at least one through hole, and a distribution area of the third vent is larger than or equal to a distribution area of the at least one through hole; the distribution area of the third vent is larger than or equal to two-third of an extending area of the top side plate; the first portion further has a plurality of perforations, one of the plurality of perforations is open toward the front side plate; the second portion has a window portion; one of the left side plate and the right side plate is a tempered glass board; the front side plate has a plurality of said at least one first fan; a number of the plurality of said at least one first fan is respectively larger than a number of the at least one second fan and a number of the at least one third fan; the plurality of said at least one first fan are located out of the assembling space; at least one of the plurality of fans is a ARGB (addressable RGB) fan; and the first vent and the third vent respectively have at least one dust screen.

* * * * *